(12) United States Patent
Zhou et al.

(10) Patent No.: US 7,192,890 B2
(45) Date of Patent: Mar. 20, 2007

(54) DEPOSITING AN OXIDE

(75) Inventors: Ying Zhou, Tigard, OR (US); Matthew V. Metz, Hillsboro, OR (US); Justin K. Brask, Portland, OR (US); John Burghard, Vernonia, OR (US); Markus Kuhn, Beaverton, OR (US); Suman Datta, Beaverton, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 134 days.

(21) Appl. No.: 10/696,204

(22) Filed: Oct. 29, 2003

(65) Prior Publication Data

US 2005/0095792 A1 May 5, 2005

(51) Int. Cl.
*H01L 21/31* (2006.01)
*H01L 21/469* (2006.01)

(52) U.S. Cl. ............... 438/778; 438/782; 257/E23.095

(58) Field of Classification Search ............... 438/678, 438/778, 782, FOR. 390, FOR. 395; 257/E23.095
See application file for complete search history.

(56) References Cited

U.S. PATENT DOCUMENTS

| | | | | |
|---|---|---|---|---|
| 3,597,834 A | * | 8/1971 | Lathrop et al. ............. | 438/625 |
| 4,297,393 A | * | 10/1981 | Denning et al. ............ | 438/655 |
| 5,830,242 A | * | 11/1998 | Yao .............................. | 23/300 |
| 5,969,419 A | * | 10/1999 | Tijburg et al. ............... | 257/753 |
| 6,420,091 B1 | * | 7/2002 | Nakayama et al. .......... | 430/302 |
| 6,679,996 B1 | * | 1/2004 | Yao .............................. | 216/40 |
| 6,780,562 B2 | * | 8/2004 | Sorori et al. ............. | 430/270.1 |
| 2004/0200962 A1 | * | 10/2004 | Ishikawa et al. ....... | 250/339.04 |

OTHER PUBLICATIONS

Robert M. Wallace, "*Challenges for the Characterization and Integration of High-k Gate Dielectrics*," pp. 1-50, Nov. 2002, http://www.mtsc.unt.edu/lemd/Presentations/AVS%202002%20Invited%20Talk.pdf.

Gerry Lucovsky, "*The Physics and Chemistry of High-k Dielectrics and their Interfaces*," pp. 1-49, available on Jun. 2003, at http://www.sematech.org/public/news/conferences/Reliability4/Documents/03_Gate_Stack_Transitor_Lucovsky.pdf.

* cited by examiner

*Primary Examiner*—Michelle Estrada
(74) *Attorney, Agent, or Firm*—Trop, Pruner & Hu, P.C.

(57) ABSTRACT

A dielectric deposited on a substrate may be exposed to a salt solution. While exposed to the salt solution, an oxide is deposited on the dielectric.

22 Claims, 2 Drawing Sheets

DEPOSITING AN OXIDE

BACKGROUND

This invention relates generally to the fabrication of semiconductor devices and specifically to deposition techniques.

Incompatibilities between the metal and oxide layers in Metal-Oxide-Semiconductor or Metal-Oxide-Silicon (MOS) structures may arise in those MOS structures having a dielectric with a high dielectric constant (high-k) and a polysilicon or metal gate electrode. For example, a MOS structure having a high-k dielectric and a polysilicon gate electrode may form nodules that may short the dielectric. Further, the nodules may pin the Fermi level in the polysilicon gate. Alternately, a MOS structure having a high-k dielectric and a metal gate electrode may experience an undesirable shift in the gate metal work function. A shift in work function may lead to unstable threshold voltages thereby affecting device performance. As such, another oxide such as a buffer oxide may be deposited between the high-k dielectric and gate material.

Buffer oxides may be deposited on a substrate via chemical vapor deposition (CVD) processing techniques. For example, deposition precursors may first be deposited on the substrate and then oxidized. However, some of the precursors used in the CVD of buffer oxide may be highly toxic and may spontaneously ignite and burn on contact with air. Thus, the CVD buffer oxide precursors pose a significant risk to those working in the semiconductor industry. Further, unconsumed CVD process gases and deposition products may be as toxic as the starting materials. Thus, there is an additional hazard to the environment at large as a result of CVD of buffer oxide.

Accordingly, there continues to be a need for deposition techniques that are both environmentally and user friendly.

DETAILED DESCRIPTION

Figure 1:
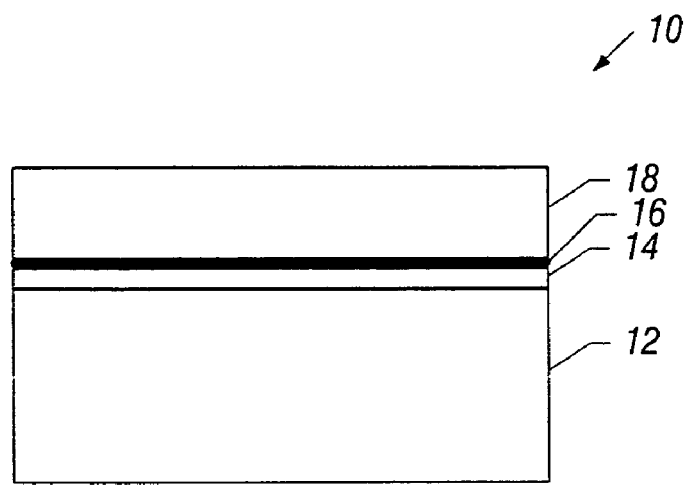
FIG. 1 is a cross sectional view of a gate stack of a MOS structure according to some embodiments of the present invention.

Referring to FIG. 1, according to some embodiments of the present invention, structure 10 such as a MOS structure as one example, may include a substrate 12, a dielectric 14, a buffer oxide 16 and a gate electrode 18. The substrate 12 may be any semiconducting material such as silicon or gallium arsenide as a few examples. Further, the dielectric 14 may be an oxide such as silicon dioxide ($SiO_2$), hafnium oxide ($HfO_2$) or zirconia ($ZrO_2$) as a few examples. Generally, hafnium oxide and zirconia are considered high-k dielectrics because they have high electrical permittivity. The dielectric 14 may be very thin, for example, 20 angstroms or less, although embodiments are not limited in this respect. The gate electrode 18 may be any suitable gate material such as a metal or polysilicon.

The buffer oxide 16 may be any oxide to buffer undesirable interactions between the dielectric 14 and the gate material 18. For example, the buffer oxide 16 may have a lower dielectric constant than the dielectric 14. As such, the buffer oxide 16 may form a more stable interface with a subsequently deposited gate material 18 than the dielectric 14. Further, the buffer oxide 16 may react with the dielectric 14 to remove any preexisting oxygen deficiencies or impurities and/or to passivate the dielectric 14 surface. Chemically, the buffer oxide 16 may be relatively stable, which buffers, or lessens the reactivity between the dielectric 14 and the gate electrode 18. As such, adverse interactions between the dielectric 14 and gate 18 may be attenuated if not eliminated. Nevertheless, according to certain embodiments of the present invention, the oxide 16 is ultra-thin (although embodiments are not limited to ultra-thin buffer oxide 16). In this way, overall gate stack capacitance may not be compromised.

As described herein, the buffer oxide 16 is aluminum oxide ($Al_2O_3$) and the dielectric 14 is hafnium oxide, although embodiments are not so restricted. Generally, aluminum oxide is relatively stable and has a lower dielectric constant than hafnium oxide. As such, aluminum oxide may form a more stable interface with a subsequently deposited gate 18 material.

Figure 2:
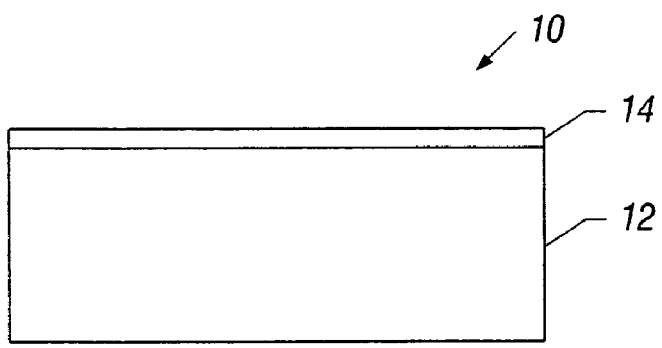
FIG. 2 is a cross sectional view of the gate stack of FIG. 1 during device fabrication.

Referring to FIG. 2, during device fabrication the substrate 12 may be silicon having hafnium oxide 14 deposited thereon. The hafnium oxide 14 may be deposited on the substrate 12 by any conventional means such as sputter deposition, CVD or high-density plasma CVD as a few examples. Thereafter, the substrate 12 may be immersed in an oxide deposition solution according to embodiments of the present invention.

Figure 3:
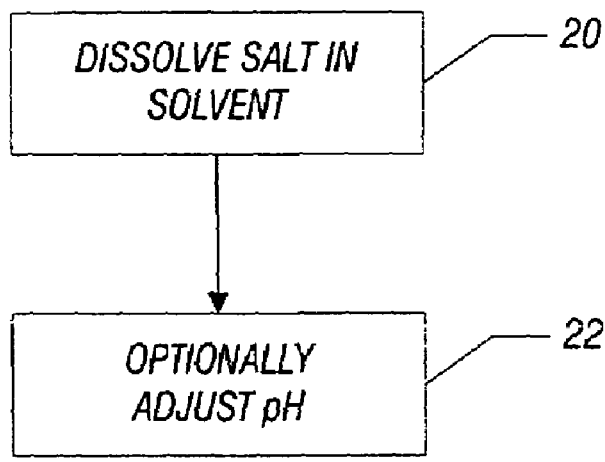
FIG. 3 is a flow chart for the preparation of an oxide deposition solution according to some embodiments of the present invention.

Referring to FIG. 3, according to embodiments of the present invention, buffer oxide 16 may be deposited on a dielectric 14 via surface reactions while the substrate 12 is immersed in a "wet" oxide deposition or salt solution. For example, to deposit aluminum oxide 16 on the hafnium oxide 14, a salt such as an aluminum salt may be dissolved in a solvent, as shown in box 20. In some embodiments the aluminum salt may be aluminum chloride or aluminum nitrate that is dissolved in deionized water.

As shown in box 22, the pH of the oxide deposition solution or salt solution may be adjusted in some embodiments. For example, a base such as ammonia hydroxide or an acid such as hydrochloric acid may be added to the salt solution. In some embodiments of the present invention, the pH modifying substance may be added as process demands require such as to remove potential contaminants. Further, the pH modifying substance may be utilized to dissolve any aluminum hydroxide precipitates or hydrate aluminum ions.

Figure 4:
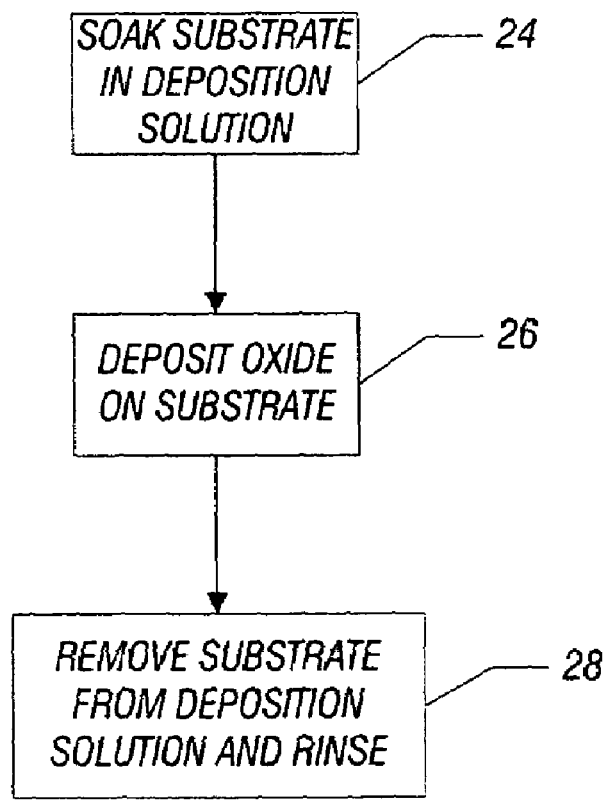
FIG. 4 is a flow chart for the deposition of oxide on the gate stack of FIG. 2 according to some embodiments.

Referring to FIG. 4, after the oxide deposition solution has been prepared, and when called for pH adjusted, the substrate 12 may be dipped in the solution, as shown in block 24. The substrate 12 may be soaked for about a few seconds to about an hour or more, although embodiments of the invention are not limited in this respect. While soaking in the salt solution, reactants in the solution and the top surface of the dielectric 14 may react to deposit the oxide 16 on the dielectric 14, as shown in block 26. For example, aluminum hydroxide $Al(OH)_3$ or hydrated aluminum ions may react with the top surface of the hafnium oxide 14 to form aluminum oxide 16. After being immersed for a desired period of time, the substrate 12 may be removed from the salt solution and rinsed for example with deionized water, as shown block 28.

The thickness of the buffer oxide 16 deposited during substrate 12 soaking may be controlled. For example, the thickness of the aluminum oxide 16 deposited on the hafnium oxide 14 may be regulated by adjusting the concentration of aluminum salt dissolved in solvent and/or the time the substrate 12 is allowed to soak in the salt solution. That is, in some embodiments of the present invention, the concentration of aluminum available for deposition may be about few parts per million (ppm) to about 1 percent or 1 mole. Accordingly, the surface concentration of aluminum oxide 16 may be modulated to range from about a few ppm or less than a complete layer to one or more atomic layers.

Figure 5:
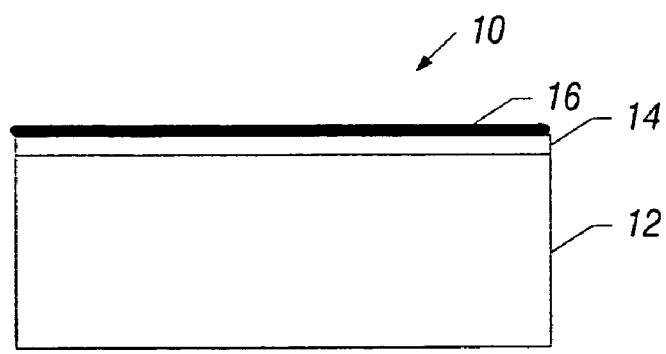
FIG. 5 is a cross sectional view of the gate stack of FIG. 2 after soaking in the oxide deposition solution according to some embodiments of the present invention.

Referring to FIG. 5, as a result of exposure to the oxide deposition solution, the oxide 16 may be deposited on the dielectric 14. For example, a desired thickness of aluminum oxide 16 may be deposited on hafnium oxide 14. Thereafter, a gate material 18 may be deposited on the oxide 16, as shown in FIG. 1.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
soaking a substrate having a dielectric deposited thereon in an aluminum salt solution, the reactants in said aluminum salt solution available for surface reaction to range from about a few pans per million to about one percent, said dielectric having a first dielectric constant;
depositing an oxide on said dielectric, said oxide having a second dielectric constant different from the first dielectric constant;
adjusting the pH of the aluminum salt solution; and
depositing a gate material on said oxide.

2. The method of claim 1 wherein depositing an oxide on said dielectric includes depositing primarily aluminum oxide on said dielectric.

3. The method of claim 1 wherein soaking said substrate in said aluminum salt solution includes soaking said substrate in a salt solution comprising aluminum chloride dissolved in water.

4. The method of claim 1 wherein soaking said substrate in said aluminum salt solution includes soaking said substrate in a salt solution comprising aluminum nitrate dissolved in water.

5. The method of claim 1 wherein depositing said oxide on said dielectric includes depositing said oxide on silicon dioxide.

6. The method of claim 1 wherein depositing said oxide on said dielectric includes depositing said oxide on hafnium oxide.

7. A method comprising:
exposing a dielectric deposited on a substrate to an aluminum nitrate solution; and
causing an oxide which is different from said dielectric to form on said dielectric, at least a portion of said dielectric to remain between said substrate and said oxide as part of a functional structure.

8. The method of claim 7 including adjusting the pH of said aluminum nitrate solution.

9. The method of claim 7 wherein causing an oxide to deposit on said dielectric includes causing reactants in said aluminum nitrate solution to react with the top surface of said dielectric.

10. The method of claim 9 wherein causing said reactants in said aluminum nitrate solution to react with the top surface of said dielectric includes depositing an aluminum oxide layer ranging in thickness from about a few parts per million to one or more atomic layers.

11. The method of claim 7 wherein exposing said dielectric to said aluminum nitrate solution includes exposing a dielectric selected from the group consisting of silicon dioxide, hafnium dioxide and zirconia to said aluminum nitrate solution.

12. The method of claim 7 including removing said substrate from said salt solution and rinsing.

13. The method of claim 7 wherein exposing said dielectric to said aluminum nitrate solution includes exposing said dielectric to said aluminum nitrate solution for about a few seconds to about an hour.

14. A method comprising:
depositing a first oxide selected from one of hafnium oxide and zirconia on a substrate using a first method of deposition; and
depositing a second oxide other than said first oxide on said first oxide by immersing said substrate in an aluminum salt solution, the top surface of said first oxide to react with said aluminum salt solution, said deposition by immersing said substrate in the aluminum salt solution being different from said first method of deposition.

15. The method of claim 14 including causing about a few parts per million of aluminum oxide to one or more atomic layers of aluminum oxide to deposit on said dielectric.

16. The method of claim 14 including adjusting the pH of said aluminum salt solution.

17. The method of claim 14 including forming a gate material on said second oxide.

18. The method of claim 14 wherein depositing a first oxide on a substrate includes using a chemical vapor deposition technique to deposit said first oxide.

19. A method comprising:
exposing a dielectric deposited on a substrate to a salt solution, the salt solution to react with an exposed surface of said dielectric to form an oxide on said dielectric other than said dielectric if said dielectric is an oxide; and
forming a layer of a gate material over said dielectric and said oxide, at least a portion of said dielectric, oxide, and gate material part of a semiconductor device after processing is complete.

20. The method of claim 19 wherein exposing said dielectric to a salt solution includes exposing said dielectric to an aluminum salt solution.

21. The method of claim 19 wherein exposing said dielectric includes exposing one of hafnium oxide, silicon dioxide, or zirconia.

22. The method of claim 19 wherein exposing said dielectric includes exposing a dielectric to a pH adjusted salt solution.

* * * * *

UNITED STATES PATENT AND TRADEMARK OFFICE
CERTIFICATE OF CORRECTION

PATENT NO. : 7,192,890 B2
APPLICATION NO. : 10/696204
DATED : March 20, 2007
INVENTOR(S) : Ying Zhou et al.

It is certified that error appears in the above-identified patent and that said Letters Patent is hereby corrected as shown below:

Column 3:
Line 33, Claim 1 "pans" should be --parts--.

Signed and Sealed this

Fourteenth Day of August, 2007

JON W. DUDAS
*Director of the United States Patent and Trademark Office*